United States Patent [19]

Stearns

[11] Patent Number: 4,484,345
[45] Date of Patent: Nov. 20, 1984

[54] PROSTHETIC DEVICE FOR OPTIMIZING SPEECH UNDERSTANDING THROUGH ADJUSTABLE FREQUENCY SPECTRUM RESPONSES

[76] Inventor: William P. Stearns, P.O. Box 398, Scottsdale, Ariz. 85252

[21] Appl. No.: 470,093

[22] Filed: Feb. 28, 1983

[51] Int. Cl.³ .................. H03G 5/00; H04R 25/00
[52] U.S. Cl. .................. 381/98; 179/107 FD; 333/132
[58] Field of Search ............... 179/107 FD; 381/98, 381/102, 103; 330/126; 333/28 T, 132, 174

[56] References Cited

U.S. PATENT DOCUMENTS

| | | | |
|---|---|---|---|
| 3,784,745 | 1/1974 | Stearns | 179/1 N |
| 3,784,750 | 1/1974 | Stearns et al. | 179/1 N |
| 3,818,149 | 6/1974 | Stearns et al. | 179/107 FD |
| 3,848,091 | 11/1974 | Stearns et al. | 179/1 N |
| 3,894,195 | 7/1975 | Kryter | 179/107 FD |
| 4,366,349 | 12/1982 | Adelman | 179/107 FD |
| 4,419,544 | 12/1983 | Adelman | 179/107 FD |
| 4,422,048 | 12/1983 | Edwards | 330/126 X |
| 4,438,414 | 3/1984 | Blachot | 333/28 T |

OTHER PUBLICATIONS

S. Mangold & G. Rissler-ÅKesson, "Programmable Filter Helps Faulty Hearing", *Elteknik Med Aktuell Elektronik*, vol. 20, No. 5, Oct. 1977, pp. 64–66.
"Monaural Fittings: Prelude to Failure?", *Hearing Instruments*, vol. 33, No. 4, 1982, by W. P. Stearns, PE, pp. 9–11, 42.

*Primary Examiner*—Keith E. George
*Attorney, Agent, or Firm*—Warren F. B. Lindsley

[57] ABSTRACT

Electronic circuitry for providing compensatory amplification to restore speech clarity for aurally handicapped persons comprising multiple active filters in a lowpass, bandpass, highpass (LP/BP/HP) configuration which provides composite filter responses applicable to infinite combinations of hearing deficiencies through multiple adjustments of filter gains, BP center frequency, LP/HP break frequencies, and BP filter "Q". This action achieves a precise corrective hearing response in wearable behind-the-ear and in-the-ear hearing aids.

2 Claims, 3 Drawing Figures

PROSTHETIC DEVICE FOR OPTIMIZING SPEECH UNDERSTANDING THROUGH ADJUSTABLE FREQUENCY SPECTRUM RESPONSES

BACKGROUND OF THE INVENTION

This invention relates to the sound amplification arts and to their application in the amelioration of auditory deficiencies, both conductive and sensorineural in nature as related to the human ear. It relates particularly to apparatus for correcting deficiencies not only in a person's ability to perceive and comprehend spoken language, but also to achieve a corrective response providing near-normal or normal hearing under all conditions of environmental noise background, acoustic reverberations such as in churches and auditoriums, and perceiving directionality of sounds; i.e., restoration of conditions representative of that response by the normal human ear.

Two types of hearing loss are generally recognized: conductive and sensorineural; however, there are combinations thereof. Conductive losses are generally correctable by means of flat amplification techniques (flat audio frequency response). Sensorineural loss on the other hand is extremely more complex requiring many different combinations of frequency responses (U.S. Pat. Nos. 3,784,750 and 3,784,745) to correct such a hearing loss to near-normal or normal hearing. As many different hearing responses exist as there are variations of corrective lenses for the eyes. Of significance is the fact that many ears have responses analogous to extreme astigmatism in the eyes. The pure conductive losses are statistically very small, on the order of five percent, and many are correctable by surgical techniques. However, the proportion of sensorineural losses is very extensive, with a vast number of such losses resulting from environmental noise damage. Correction of these losses requires very sophisticated fitting techniques, including, of major importance, highly adjustable corrective audio frequency responses.

Previous techniques involving apparatus for correcting deficiencies described in the referenced two patents only partially resolved the problem of providing a corrective hearing response since filter bands were fixed in their bandpass responses and/or insufficient bands were included to provide the optimum corrective response (U.S. Pat. No. 3,818,149).

One difficulty with successful implementation of previous techniques associated with the referenced patents was the inflexibility of achieving the optimum corrective frequency spectrum because of deficiencies in the electronic implementation techniques involved. This arises from the fact that a corrective frequency response for hearing is highly variable from individual to individual depending upon the type of loss; i.e., conductive or sensorineural or combination thereof, and the difficulties in achieving such a corrective response because of many variable factors involved, including size of the ear canal, coupling to the ear through the earmold configuration, and level of perceived amplification. Some people require more power and gain than others for a particular threshold response. New information as published in HEARING INSTRUMENTS (Vol. 33, No. 14, 1982) has shown the significant importance of obtaining acoustical balance between the two ears. If a corrective response is necessary for each ear and if one ear is misfit, it can have a significant imbalance effect and preclude clear speech understanding, particularly in the presence of environmental background noise and reverberations. Thus it becomes of paramount importance to precisely fit each ear with the optimum corrective frequency response and thus preclude difficulties in speech understanding in the real world situations present in normal living. Furthermore, evidence has shown that only through balanced hearing with proper corrective responses can one obtain near-normal overall hearing responses, including music appreciation, directionality of sound, etc.

DESCRIPTION OF THE PRIOR ART

This application is an improvement of the inventive concepts disclosed in U.S. Pat. Nos. 3,818,149; 3,848,091; 3,784,745 and 3,784,750 which are directed to apparatus and methods for providing compensatory amplification for aurally handicapped persons.

U.S. Pat. Nos. 3,784,750 and 3,784,745 are directed to methods and apparatus for determining the frequency response characteristics to be incorporated into sound amplification apparatus utilized by aurally handicapped people to correct such a hearing loss to near-normal hearing.

U.S. Pat. No. 3,818,149 is directed to circuitry providing compensatory amplification for aurally handicapped persons wherein the electronic circuitry divides the audible frequency spectrum into a plurality of adjacent frequency bands through the use of an adjustable filter network to provide compensatory amplification in a prosthetic device in a practical wearable form.

U.S. Pat. No. 3,848,091 is directed to a method of fitting a prosthetic device for providing compensatory amplification for aurally handicapped persons which includes the steps of determining absolute threshold information and tone discomfort information, and coupling the subject to a master hearing aid which includes a filter network selected to be in the general range of the acuity deficiency as determined by the above information. Forced-choice, paired-comparison techniques using continuous verbal discourse gives the required information for selecting the appropriate filter, filter gain and flat gain parameters to be used as a single filter network in a prosthetic device.

SUMMARY OF THE INVENTION

Although the previously mentioned patents are directed to similar subject matter, the present application is intended to correct deficiencies in this prior art. The claims of this application are directed to an electronic auditory correction circuit and system having the following capabilities:

a. variable audio frequency spectrum response having multiple frequency bands wherein each band is widely adjustable as to both gain and frequency response; each band is adjustable for multiple break frequencies, either low, high or combination thereof which enables precise selective control;

b. specific and individual intensities or volume control associated with frequency response;

c. specific and individual adjustable break frequency controls;

d. electro-transduction of electronically processed signals into acoustic signals; and e. preamplification and mixing of input signals for broadband intensity control.

It is, therefore, one object of this invention to provide a new and improved electronic auditory correction system for optimizing speech understanding through adjustable frequency spectrum responses.

Another object of this invention is to provide an improved electronic auditory corrective system having the characteristics described above.

Another object of this invention is to provide sufficiently miniaturized hearing aid apparatus for wearing by aurally handicapped persons to be accomplished by electronic techniques.

Further objects and advantages of this invention will become apparent as the following description proceeds and the features of novelty which characterize this invention will be pointed out with particularity in the claims annexed to and forming part of this specification.

BRIEF DESCRIPTION OF THE DRAWING

The present invention may be more readily described with reference to the accompanying drawing in which.

DESCRIPTION OF THE PREFERRED EMBODIMENT

Figure 1:
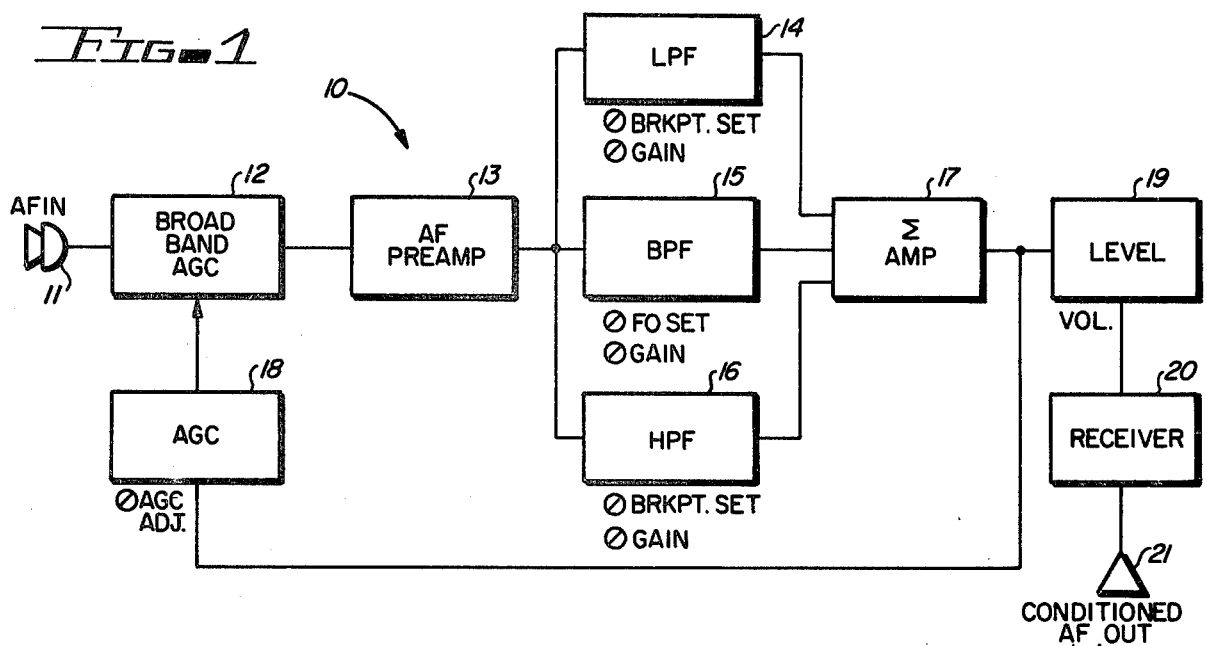
FIG. 1 is a block diagram illustrating an exemplary embodiment of the basic concepts utilized in the present invention to provide corrective spectrum response amplification in accordance with the concepts of the invention.

Referring more particularly to the drawing by characters of reference, FIG. 1 discloses an electronic configuration 10 for a basic hearing aid which can be adjusted to duplicate a subject's required corrective frequency response. The resulting hearing aid, through variations in the electronic circuit implementation, will be wearable and may be as small as practical for such use and readily adapted to manufacture in a miniaturized wearable form, including not only BTE (behind-the-ear), but ultimately ITE (in-the-ear) structures. The basic components of such a hearing aid include a transducer, such as a miniature ceramic microphone 11, a broadband automatic gain control (AGC) 12, an audio-frequency (AF) preamplifier 13, a triple channel filter network consisting of a low pass filter (LPF) 14, a bandpass filter (BPF) 15, and a high pass filter (HPF) 16, a summation amplifier 17, an automatic gain control (AGC) circuit 18, a level adjustment 19, and a receiver/transducer 20-21.

The output of microphone 11 is connected to the input of broadband automatic gain control (AGC) 12 which provides amplification of high and low microphone signal levels, with application of broadband automatic gain control signals to equalize signal levels, appearing at filter preamplifier 13.

The broadband AGC output is connected to the input of AF preamplifier 13 which establishes appropriate signal levels and impedances to drive the triple channel filter network 14, 15, 16.

The functions of the three filter channels are as follows: The LPF 14 provides a variable response at the low end of the audio speech band through adjustments of filter gain and lowpass break frequency. The break frequency of the multiple pole LP active filter is typically settable over the frequency range, 0.8 kHz to 2.8 kHz, with an additional gain control allowing changes of signal level through the passband. A filter characteristic that has a maximum degree of flatness in the pass region yields the best performance. An example of such a filter is the Butterworth as described on page 191 of "Reference Data for Radio Engineers," Fourth Edition, Copyright 1956 by International Telephone and Telegraph. The BPF 15 provides a mid-band frequency response adjustment. In this case the channel gain and the "Q" of the filter are individually adjustable, where the "Q" or quality factor (wL/R) determines the bandwidth or the sharpness of the channel response. The multiple pole BP active filter can be set to create a notch in the overlapping HP/LP frequency responses. Control of "Q" and gain would typically be provided to modify the slope and signal amplitude. The HPF 16 provides an adjustable frequency response at the high side of the audio frequency spectrum with typical break frequencies of 1.4 kHz to 4.4 kHz. Independent adjustment of channel gain is again provided. The HPF would typically be a multiple pole HP active filter with its break frequency settable over a specified frequency range.

The summation amplifier 17 provides the appropriate impedance-matching circuitry to combine the multiple channel filter input signals from the LP/BP/HP filter network. A sample composite signal is also provided to the AGC circuit 18. The AGC circuit 18 accepts signals from the summing amplifier 17 and establishes an automatic gain control signal which is then applied to the broadband AGC microphone amplifier 12 for broadband gain control. AGC levels are controllable through adjustment in the AGC circuit 18. The level adjustment 19, a post-filter amplifier, provides overall volume control and may be adjusted by the wearer of the hearing aid. The typical broadband receiver 20 drives a magnetic transducer 21.

Figure 2:
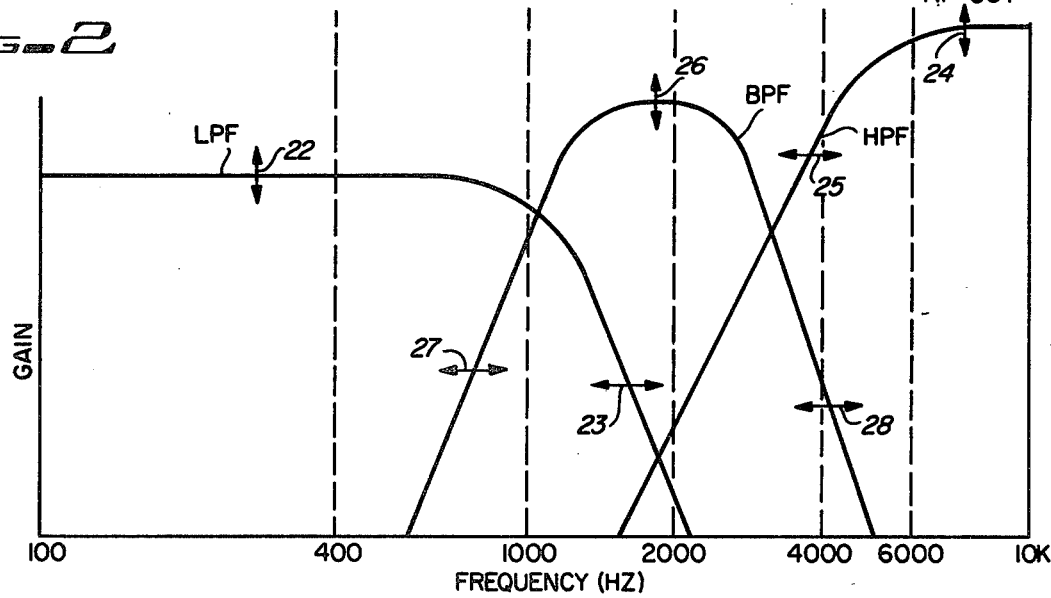
FIG. 2 is a composite filter response representative of the type required for auditory correction achievable through electronic circuit implementation of the block diagram in FIG. 1.
Figure 3:
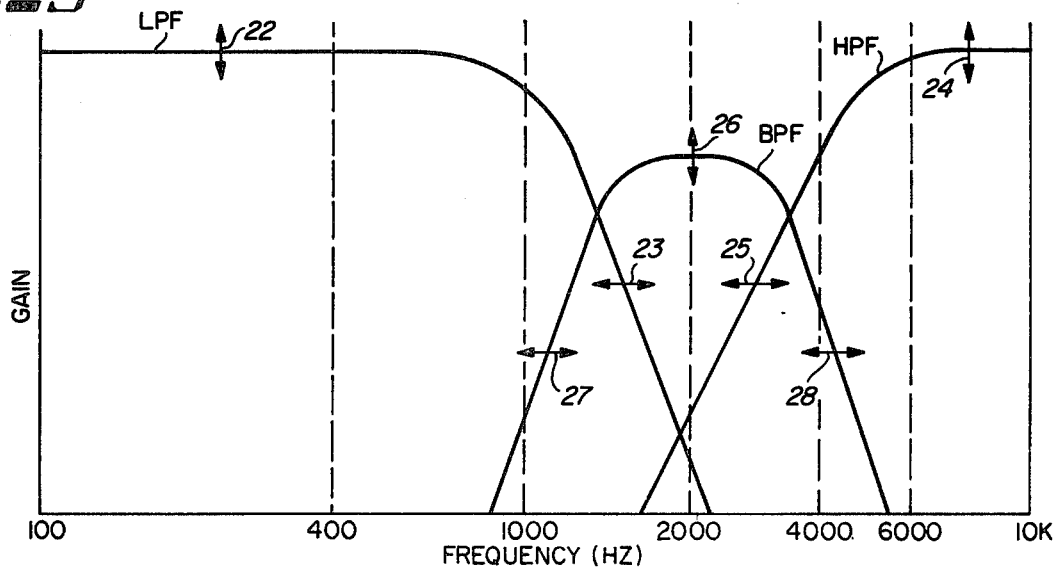
FIG. 3 is a variation of the composite filter response representative of the type required for auditory correction achievable through electronic circuitry implementation of the block diagram in FIG. 1. The composite filter responses are illustrative only to the extent that they are representative corrective responses. Adjustments of filter gains, break frequencies and bandpass filter Q permit correction of an infinite variety of auditory deficiencies.

The effect of the various adjustments described in the foregoing paragraphs on the response characteristics of the individual filter channels is illustrated in FIGS. 2 and 3.

For the low pass filter (LPF) the gain adjustment raises or lowers the flat horizontal portion of the response as indicated by double-pointed arrow 22, while the break frequency adjustment moves the sloping portion to the left or right, as indicated by arrow 23. Similarly, for the high pass filter (HPF) the gain adjustment raises or lowers the flat horizontal portion of the response, as indicated at 24, and the break frequency adjustment moves the sloping portion to the left or the right, as indicated at 25. In the case of the band pass filter (BPF) the gain adjustment raises or lowers the flat horizontal crest of the response, as indicated at 26, while the "Q" adjustment broadens or narrows the response. A reduction in the "Q", for example, broadens the response by moving the sloping portions of the curve at 27 and 28 apart, while an increase in the "Q" narrows the response by moving the sloping portions closer together. It will be appreciated that through the implementation of such individual adjustments the response curves shown in FIG. 2 may be shaped to conform to the somewhat different response curves shown in FIG. 3. It will also be noted that for a given hearing deficiency one or the other of the two responses shown by FIGS. 2 and 3 will more appropriately provide the needed correction. Furthermore, it may be found that neither is optimum in a given case so that specific adjustments are required as dictated by the prior testing performed on the patient.

The electronic functions indicated in FIG. 1, Block Diagram of the basic hearing aid, may be realized using, but not limited to, the implementation techniques described in the following paragraphs.

The microphone 11, may be a miniature ceramic transducer similar to the Knowles EA Series. Such a unit has a frequency response from less than 100 Hz to greater than 8000 Hz, as measured by standard hearing aid microphone measurement techniques. Audio frequency signals received by microphone 11, which may contain an integral preamplifier, are fed to the audio preamplifier 13 via a broadband automatic gain control, AGC 12. Broadband automatic gain control means may be accomplished by use of a programmable electronic resistive network or by a direct current control signal applied to the bias network of an audio amplifier or by any other means whereby the signal level is controllable as a function of a feedback signal.

Audio preamplifier 13 may consist of discrete chip semiconductors and passive components such as resistors and capacitors arranged in any circuit configuration to provide sufficient amplification and consequential signal levels to drive a plurality of filters; namely a lowpass 14, a bandpass 15 and a highpass 16 filter(s).

The AF preamplifier 13 may also be configured using a low noise, high gain operational amplifier or a multiplicity thereof, which are well known in the art. Operational amplifiers, such as the Motorola MC 1776 may be used throughout the hearing aid, to utilize its salient features of high input impedance, low input noise, internal compensation and low power supply currents with attendant low operating voltage.

Lowpass filter 14 may be configured using the type operational amplifier previously described for use in preamplifier 13. Passive components associated with the operational amplifier may be realized in the discrete chip form or in either thick or thin film configurations. Selection of the type of component to be used in the hearing aid will depend upon whether the aid is worn externally (BTE) or internally to the ear (ITE). The LP break frequency is adjustable by varying one or more of the resistive components by use of a microminiature potentiometer. Similarly, the selection of a suitable break frequency may be accomplished by physically changing the appropriate resistive component by direct replacement or by laser trimming of thick film components prior to final hearing aid fabrication.

The LP filter 14 may be of any appropriate configuration such as the Butterworth type and of the single-pole or multiple-pole types which are well known in the art. Choice of the number of poles will be predicated on certain requirements to meet a large population of corrective responses; more poles provide steeper roll-off characteristics of the lowpass filter frequency response curves. Adjustable gain control may be provided by secondary variable resistive elements such as a microminiature potentiometer or through appropriate selection of discrete resistive components or by laser trimming of thick film type components.

The bandpass filter 15, may be composed of similar components as described for the lowpass filter 14. The bandpass filter 15, may be configured such that its passband is adjustable above and below its designed center frequency. Shift of center frequency may be accomplished by either changing appropriate capacitance and/or resistive components comprising the bandpass filter. A gain control may be provided to permit variable signals to appear at the filter output. Gain control may be achieved through the selection of appropriate resistance by component selection, laser trimming of thick film components or through the utilization of microminiature potentiometer adjustment. Passband characteristics will be determined by the type filter and/or the number of poles (order of) of the filter. Specific passband characteristics will be predicated on an analysis of the hearing loss profile of a large population of patients. Frequency roll-off characteristics at both low and high frequency sides of the filter may be altered by suitable selection of the number of poles used therein for specific patients, or by adjustment of the filter "Q" through suitable resistive loading of the active filter.

The highpass filter 16, is similar to the lowpass filter 14, with the exception of the break frequency. Through similar circuit implementation techniques, a plurality of break frequencies may be settable to accommodate individual patient requirements. Gain control is achievable by appropriate selection of resistive components comprising the active filter or through use of additional amplifiers serving as post filter amplification stages following filters 14, 15 and 16. Single or multiple poles may be incorporated in the active filter to set the steepness of the cut-off frequency characteristics.

The summation amplifier 17 consists of a low power, differential input operational amplifier similar to the Motorola MC 1776. Summation of signals emanating from the lowpass filter 14, bandpass filter 15 and highpass filter 16 may be accomplished linearly by resistive summation at the input of the operational amplifier. Other means, well known in the art, may be used to provide linear summation of the filter outputs such as application of the filter outputs to the negative (inverting) and positive (non-inverting) differential inputs of the operational amplifier.

A control signal derived from the summed audio signals at the summation amplifier 17, is conditioned by an automatic gain control circuit 18, consisting of conventional semiconductor chip devices such as diodes, resistors, capacitors, transistors and/or operational or other types of linear integrated circuits. Peak detection and appropriate integration techniques and time constants are provided to develop a control signal which may be either a voltage or current whose amplitude or level is used to modify the gain of the broadband amplifier 12.

A single level (volume) control provides overall level adjustment of the composite audio signal. The control may be a microminiature potentiometer coupled to the amplifier and designed to properly match the input impedance of the magnetic receiver, typically a Knowles ED or CI Receiver. Various types of potentiometers may be used such as linear, non-linear or audio taper, dependent upon the patient's requirements.

Power to the hearing aid may be provided by longlife battery(ies) of the chargeable or non-rechargeable type. Throughout the design and implementation of the hearing aid, low power consumption techniques are employed to prolong battery life.

The range of corrective responses to be incorporated as adjustments in the electronic circuits and the optimum number of adjustable settings required in the filters for corrective hearing response will be determined from a wide range of Otograms (threshold test responses) of aurally handicapped patients. The Otogram is a threshold plot of the hearing response in sound pressure level (dB Re 0.0002 microbar) and is patterned after Beckesy audiometry and displays the precise hearing level as a continuous function of frequency. An analysis of the Otogram thus enables determination of the acoustical gains and frequencies required for hearing correction.

The necessary filters and adjustments thereto can be incorporated in the form of highly miniaturized electronic circuits applicable both to BTE's and ITE's while maximizing corrective response adjustments to an extent not realized heretofore. Hence, further refinements to those electronic circuit embodiments described herein may be accomplished to realize the objectives of maximizing speech clarity and overall hearing response.

While specific embodiments and applications of this invention have been shown and described, it will be apparent to those skilled in the art that other modifications are possible without departing from the inventive concepts herein described. The invention thereof is not to be restricted except as necessary by the prior art and by the spirit of the appended claims.

What is claimed is:

1. Prosthetic apparatus for providing compensatory amplification for aurally handicapped persons comprising:

input circuit means for receiving signals to be amplified over selected first, second and third pass bands, an audio frequency preamplifier for receiving signals from said input circuit means for generating audio level frequency signals for driving a multiple channel filter network, a multiple-channel filter network comprising a first filter having a variable response at the low end of an audio speech band, a second filter having a variable response at the middle of the audio speech band, and a third filter having a variable response at the high end of the audio speech band, said first filter comprising means for adjustably controlling its gain and for adjustably setting its break frequency over a freguency range of approximately 0.8 kHz to 2.8 kHz to control the first filter's lowpass frequency responses, said second filter comprising means for providing mid-range variable bandpass frequency response adjustments with the channel gain, the "Q", and center frequency of said second filter being individually adjustable to control the amplitude of signals passed and the width and center frequency of its pass band, said third filter having a break frequency of approximately 1.4 kHz to 4.4 kHz and comprising means for adjustably controlling this break frequency and its gain to control said third filter's highpass frequency responses, adjustments means for individually controlling the filter gains, center frequency response of said second filter, the break frequency of said first and third filters, and the bandpass filter "Q" of the second filter to provide precise corrective hearing responses, means for coupling said audio level frequency signals to said filter network, a summation amplifier means coupled to the outputs of said filter network for combining signals from said first, second and third filters, a gain control coupled to the output signal of said summation means for generating a signal which is coupled to said input circuit means for compression of said signals over said filter network, and output circuit means coupled to said summation means for driving an audio frequency receiver.

2. Prosthetic appratus for providing compensatory amplification for aurally handicapped persons comprising:

a multi-channel filter network, each filter of said network having a frequency response and acoustical gain which can be independently adjustably varied to provide a corrective hearing response based upon threshhold otograms, said multi-channel filter network comprising a three-channel filter assembly connected in a parallel arrangement, and said three-channel filter assembly comprising a first filter having a variable response at the low end of an audio speech band, a second filter having a variable response at the middle of the audio speech band, and a third filter having a variable response at the high end of the audio speech band, said first filter comprising means for adjustably controlling its gain and for adjustably setting its break frequency over a frequency range of approximately 0.8 kHz to 2.8 kHz to control the first filter's lowpass frequency response, said second filter having a channel gain, "Q", and center frequency which is individually adjustable to control amplitude of signals passed, and the bandwidth and center frequency of the second filter's response, said third filter having a break frequency of approximately 1.4 kHz to 4.4 kHz and means for adjustably controlling this break frequency and its gain to control said third filter's highpass frequency responses.

* * * * *

UNITED STATES PATENT AND TRADEMARK OFFICE
CERTIFICATE OF CORRECTION

PATENT NO. : 4,484,345
DATED : November 20, 1984
INVENTOR(S) : William P. Stearns It is certified that error appears in the above-identified patent and that said Letters Patent is hereby corrected as shown below:

Column 8, line 8, delete "adjustments" and substitute
---adjustment---.

Column 8, line 25, delete "appratus" and substitute
---apparatus---.

Signed and Sealed this

Thirtieth Day of April 1985

[SEAL]

Attest:

DONALD J. QUIGG

Attesting Officer

Acting Commissioner of Patents and Trademarks